(12) United States Patent
Lehninger et al.

(10) Patent No.: US 12,745,447 B2
(45) Date of Patent: Sep. 22, 2026

(54) STRUCTURAL ELEMENT WITH IMPROVED FERROELECTRIC POLARISATION SWITCHING AND RELIABILITY AND METHOD FOR PRODUCING SAID STRUCTURAL ELEMENT

(71) Applicant: Fraunhofer-Gesellschaft zur Förderung der Angewandten Forschung E.V., Munich (DE)

(72) Inventors: David Lehninger, Dresden (DE); Ayse Sünbül, Dresden (DE); Maximilan Lederer, Dresden (DE); Konrad Seidel, Dresden (DE)

(73) Assignee: Fraunhofer-Gesellschaft zur Förderung der Angewandten Forschung E.V., Munich (DE)

(*) Notice: Subject to any disclaimer, the term of this patent is extended or adjusted under 35 U.S.C. 154(b) by 392 days.

(21) Appl. No.: 18/492,819

(22) Filed: Oct. 24, 2023

(65) Prior Publication Data

US 2024/0145572 A1 May 2, 2024

(30) Foreign Application Priority Data

Oct. 26, 2022 (DE) ..................... 10 2022 211 354.3

(51) Int. Cl.

| | |
|---|---|
| ***H10D 64/68*** | (2025.01) |
| ***H10D 1/00*** | (2025.01) |
| ***H10D 1/66*** | (2025.01) |
| ***H10D 1/68*** | (2025.01) |

(52) U.S. Cl.

CPC ........... *H10D 64/689* (2025.01); *H10D 1/047* (2025.01); *H10D 1/66* (2025.01); *H10D 1/692* (2025.01)

(58) Field of Classification Search

CPC ........ H10D 64/689; H10D 1/047; H10D 1/66; H10D 1/692; H10D 1/68

See application file for complete search history.

(56) References Cited

U.S. PATENT DOCUMENTS

| | | | |
|---|---|---|---|
| 7,619,268 B2 * | 11/2009 | Kohlstedt | G11C 11/22 257/295 |
| 2015/0014813 A1 * | 1/2015 | Mueller | H01L 21/0228 257/532 |
| 2015/0340372 A1 * | 11/2015 | Pandey | H10D 30/0415 257/295 |

(Continued)

FOREIGN PATENT DOCUMENTS

KR 100265333 B1 10/2000

OTHER PUBLICATIONS

Popov et al., Robust semiconductor-on-ferroelectric structures with hafnia-zirconia-alumina UTBOX stacks compatible with CMOS technology, Journal of Physics D: Applied Physics, vol. 54, p. 225101, 2021.

(Continued)

*Primary Examiner* — Bitew A Dinke

(74) *Attorney, Agent, or Firm* — Marshall & Melhorn, LLC

(57) ABSTRACT

A structural element may have a ferroelectric or antiferroelectric layer formed on a substrate. The ferroelectric or antiferroelectric layer is doped with a first dopant and at least one second dopant. The ferroelectric or antiferroelectric layer can be formed of $HfO_2$ or $ZrO_2$ and doped with the first dopant Hf or Zr and with the second dopant Al, Si, La, Y, Gd or Sr.

5 Claims, 2 Drawing Sheets

(56) References Cited

U.S. PATENT DOCUMENTS

| | | | | |
|---|---|---|---|---|
| 2019/0074295 | A1* | 3/2019 | Schröder | H10B 51/30 |
| 2020/0044097 | A1* | 2/2020 | Kaempfe | H10D 48/021 |
| 2020/0321473 | A1* | 10/2020 | Ramamoorthy | H10B 53/30 |
| 2021/0035994 | A1* | 2/2021 | Lu | H10B 53/30 |
| 2021/0043749 | A1* | 2/2021 | Lee | H10D 30/701 |
| 2021/0143068 | A1 | 5/2021 | Xu et al. | |
| 2021/0265507 | A1* | 8/2021 | Peng | H01L 21/02356 |
| 2021/0305398 | A1* | 9/2021 | Chang | H10D 62/874 |
| 2022/0254795 | A1* | 8/2022 | Popovici | H10B 51/30 |
| 2022/0343980 | A1* | 10/2022 | Kamisaka | G11C 16/0483 |
| 2022/0383953 | A1* | 12/2022 | Kamisaka | H10D 30/6755 |
| 2022/0406798 | A1* | 12/2022 | Wu | H10D 64/685 |
| 2023/0035144 | A1* | 2/2023 | Roy | H10D 12/031 |
| 2023/0085754 | A1* | 3/2023 | Ino | H10B 51/20 257/295 |
| 2023/0262988 | A1* | 8/2023 | Harari | G11C 11/223 257/295 |

OTHER PUBLICATIONS

German Patent and Trademark Office, German Exan Report in Application No. DE10 2022 211 354.3, dated May 26, 2023.

* cited by examiner

STRUCTURAL ELEMENT WITH IMPROVED FERROELECTRIC POLARISATION SWITCHING AND RELIABILITY AND METHOD FOR PRODUCING SAID STRUCTURAL ELEMENT

FIELD

The present invention relates to a structural element with improved polarization switching and reliability and a method for producing said structural element.

BACKGROUND

The problem with ferroelectric materials is currently often that their reliability is greatly reduced at high temperatures and high electric field strengths. This leads to unintended leakage currents in the relevant structural element, which significantly increases the probability of dielectric breakdown.

An important factor for the reliability of the ferroelectric or antiferroelectric layer is the transition to the electrode material. Various different approaches are used to improve this transition between the ferroelectric or antiferroelectric layer.

One option is to insert a buffer layer between the ferroelectric layer and the electrode material. $Al_2O_3$ can be used for this purpose for example. Another option is to pretreat the interface region with an $NH_3$ plasma. In the aforementioned solutions the focus is on optimizing the interface region instead of optimizing the properties of the ferroelectric layer itself.

In addition, a third alternative procedure for solving the technical problem is discussed in the prior art. The so-called "grain boundary interruption" increases the reliability of the ferroelectric layer by forming a layer stack. This means that it is provided that an amorphous $Al_2O_3$ layer is inserted between two ferroelectric layers. However, it should be noted that in the case of this solution the use of a layer stack means that a reduction of the layer thickness is only possible to a limited degree.

The approach described above of a plasma treatment of the interface between the ferroelectric layer and the electrode material is described in KR 100 265 333 B1 for example. Here a method of manufacture is disclosed which is intended to increase the thermal stability of a ferroelectric capacitor by a plasma treatment on a previously deposited Pt electrode. The disadvantage here is that this approach only focuses on the surface region and does not change the properties of the ferroelectric layer as such.

SUMMARY

The present invention is therefore based on the problem of proposing a structural element which avoids the said disadvantages, i.e. which has improved ferroelectric polarization switching and high reliability at high temperatures and high electric fields.

This problem is solved according to the invention by a structural element and a method for producing the structural element according to the claims. Advantageous embodiments and further developments are described in the dependent claims.

The structural element comprises a ferroelectric or antiferroelectric layer formed on a substrate which is doped with a first dopant and at least one second dopant.

By using two different dopants in a ferroelectric or antiferroelectric layer the morphology of the polycrystalline layer can be changed. In this way it is possible to influence the proportion of the amorphous phase in the polycrystalline, ferroelectric or antiferroelectric layer as well as the grain size directly via the concentration of the dopants. In this way it is possible to reduce leakage currents which propagate along the grain boundaries through the layer. This leads to a direct reduction of leakage currents in the ferroelectric or antiferroelectric layer during operation at high temperatures and strong electric fields. At the same time the ferroelectric properties remain virtually unchanged. The reduction of leakage currents is also further improved by having significantly smaller grain sizes.

Furthermore, the ferroelectric or antiferroelectric layer can be made of hafnium oxide, $HfO_2$, or zirconium oxide, $ZrO_2$.

The use of ferroelectric materials $HfO_2$ or $ZrO_2$ which are widely used in industry, ensures that the structural element can be integrated into existing structural element concepts in a simple manner without requiring any further structural modifications.

In addition, the first dopant can comprise hafnium (Hf) when $ZrO_2$ is used and can comprise zirconium (Zr) when $HfO_2$ is used, i.e. the first dopant comprises or consists of Hf with a ferroelectric or antiferroelectric $ZrO_2$-layer and Zr with a ferroelectric or antiferroelectric $HfO_2$-layer.

By using Zr or Hf as the first dopant depending on the material used for the ferroelectric or antiferroelectric layer, it is ensured that there is a mixed oxide of $HfO_2$ and $ZrO_2$ (HZO) prior to doping with the second dopant. HZO layers are currently frequently used in research and in industry due to the comparatively easy way of changing the hysteresis curve and due to the potentially strong ferroelectric properties.

In this respect, the dopant concentration of the first dopant can be in a range of 0.1-50 at. % (atomic percent), preferably in a range of 25-50 at. %, particularly preferably in a range of 45-50 at. %, i.e. the molar fraction of the first dopant is 0.1-50 at. %, preferably 25-50 at. % and particularly preferably 45-50 at. %.

By specifying the broad spectrum of concentration ranges of the first dopant it is ensured that changes in the macroscopic behavior with respect to the ferroelectric or antiferroelectric properties only result from intended process adjustments and are not already caused by minor process-related variations. Nevertheless, a range as previously disclosed is particularly preferred since in this range the most pronounced ferroelectric behavior with the known polarization curve and the maximum remanent polarization can be expected. By maximizing the remanent polarization the reliability of the structural element as well as the switching characteristics are improved. In addition, in the event of the maximum achievable remanent polarization the orthorhombic phase in the material is stable.

Furthermore, the second dopant may comprise aluminum (Al), silicon (Si), lanthanum (La), yttrium (Y), gadolinium (Gd) or strontium (Sr). It is also possible to use silicon (Si) as the first dopant and, in particular when using silicon as the first dopant, to use aluminum (Al) as the second dopant. In the case of using silicon as the first dopant, the dopant concentration would be significantly lower and a hafnium silicon aluminum oxide layer (HSAO) may be used.

By having one of the aforementioned materials as the second dopant in the ferroelectric or antiferroelectric layer, the hysteresis curve and the maximum remanent electric polarization can be further optimized. In this way the structural element can be individually adapted according to the application.

In this respect, the dopant concentration of the second dopant can be in a range of 0.1-10 at. %, preferably in a range of 1-5 at. %.

In this respect, reference can be made to similar advantages as for the adjustment of the dopant concentration of the first dopant. By the preferred use of the dopant concentration in the range of 1-5 at. % a maximum remanent electric polarization can be achieved. For example the ideal dopant concentration for Al is 2 at. % and for Si is 3 at. %.

With the addition of the second dopant, hereby the concentration of the first dopant should be reduced accordingly with respect to the total proportion, i.e. in the case of an ideal addition of the second dopant of for example 22 vol.-% (volume percent) of the total layer (wherein the dopant concentration relative to the part volume is in the range of 1-5 at. %) the first dopant is adjusted to a dopant concentration of 40-50 at. % relative to the remaining 78 vol.-%.

Typically, the ferroelectric or antiferroelectric layer may have a layer thickness of 1-20 nm, preferably 5-15 nm.

The advantage of preferably using 5-15 nm thick ferroelectric or antiferroelectric layers is that it avoids the problem that the orthorhombic phase becomes unstable with greater layer thicknesses and thus the expression of the ferroelectric properties decreases. Furthermore, it should be noted that the dopant concentrations just described of the first dopant and the second dopant have to be formed as a function of the selected layer thickness. These variations are taken into account by the corresponding specifications of the dopant concentration ranges.

In addition, the substrate on which the ferroelectric or antiferroelectric layer is formed can be in the form of an electrode.

By forming an electrode the electric contacting of the ferroelectric or antiferroelectric layer is made in the relevant structural elements and thus allows simple integration into existing structural element structures. For certain applications, a second electrode can also be provided on the ferroelectric or antiferroelectric layer. In both cases, titanium nitride, TiN, can be used as the electrode material for example.

It can be provided that an intermediate layer is arranged on the ferroelectric or antiferroelectric layer, for example made of silicon dioxide ($SiO_2$) or SiON. A possible layer sequence is then a silicon layer, an intermediate layer of silicon dioxide followed by the ferroelectric or antiferroelectric layer and a final metallic layer. When using specific semiconductors such as indium-gallium-zinc-oxide (IGZO) the intermediate layer can also be omitted.

In addition, a method for producing the structural element comprises a substrate, on which a ferroelectric or antiferroelectric layer is already present or has been deposited. Afterwards, the layer produced in this way is firstly doped with a first dopant and then, or at the same time as the doping of the first dopant, is doped with a second dopant.

The ferroelectric or antiferroelectric layer can be applied layer-by-layer using the so-called ALD method (atomic layer deposition). The doping with the first and the second dopant can be performed by diffusion or ion implantation. These methods are established processes in the semiconductor industry and can thus be integrated into existing processes without any problems.

The method is devised to produce the already described structural element, i.e. the already described structural element can be produced by the explained method.

Exemplary embodiments of the structural element are represented in the drawings and are described below with reference to FIGS. 1, 2 and 3. Recurring features are provided with identical reference signs.

DETAILED DESCRIPTION

Figure 1:
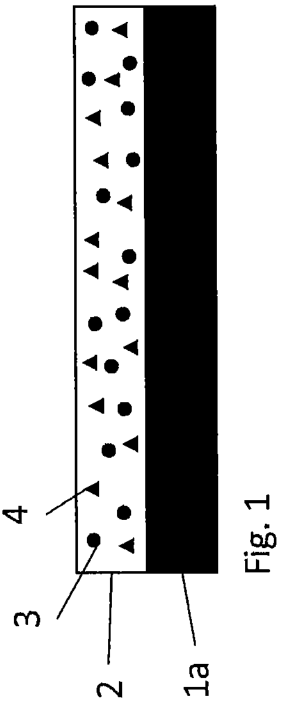
FIG. 1 shows a schematic representation of the doped ferroelectric or antiferroelectric layer on a substrate.

FIG. 1 shows a schematic representation of a ferroelectric or antiferroelectric layer 2 with a first dopant 3 and a second dopant 4 on a substrate 1*a*. In this exemplary embodiment $HfO_2$ is used as the ferroelectric or antiferroelectric layer 2. Zr with a dopant concentration of 39 at. % (50 at. % at 78 Vol.-%) is used as the first dopant 3 and Al with a dopant concentration of 0.1-4.4 at. % (1-5 at. % at 22 vol.-%) is used as a second dopant 4, which are introduced into the ferroelectric or antiferroelectric layer 2 by means of atomic layer deposition. The above percentages can be typically given as a ratio. A typical ratio between Hf in the ferroelectric or antiferroelectric layer 2 and the first dopant 3 Zr is 1:1. For the second dopant 4 Al, the optimum ratio to Hf is 1:16-20. When using an alternative dopant, e.g. Si, the optimum ratio changes to 1:16. The layer thickness of the ferroelectric or antiferroelectric layer is here 2 10 nm and was deposited by the ALD method. The substrate 1*a* is formed as an electrode from the material TiN.

The thus presented structural element has an HZAO layer (hafnium-zirconium-aluminum-oxide), which has significantly reduced grain diameters compared to the conventional HZO layers (hafnium-zirconium-oxide). This causes a reduction of leakage current paths along the grain boundaries and thus increases the resistance of the ferroelectric or antiferroelectric layer 2 to leakage currents.

Figure 2:
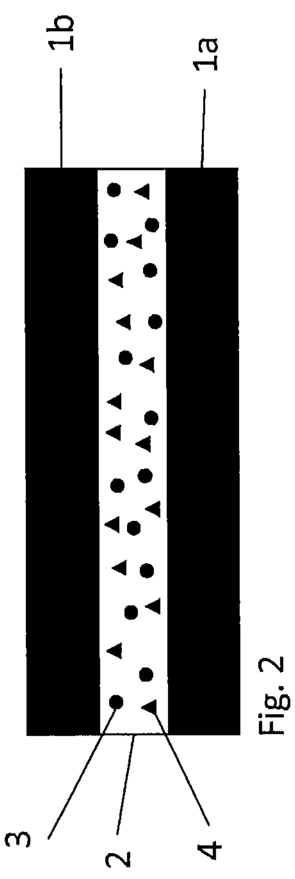
FIG. 2 shows a schematic representation of the doped ferroelectric or antiferroelectric layer between two substrates.

FIG. 2 is a schematic representation of a ferroelectric or antiferroelectric layer 2 with a first dopant 3 and a second dopant 4 between a substrate 1*a* and a substrate 1*b*. In this exemplary embodiment both the substrate 1*a* and also the ferroelectric or antiferroelectric layer 2 are formed in the same way as in FIG. 1. In addition however, a further layer 1*b* is formed on the ferroelectric or antiferroelectric layer 2.

By means of the embodiment variant shown in FIG. 2 it is possible to integrate the ferroelectric or antiferroelectric layer 2 as a capacitor into an electronic structural element. FIG. 2 shows the integration into a MOS capacitor (metal-oxide semiconductor), wherein here an intermediate layer can additionally be formed between the ferroelectric or antiferroelectric layer 2 and the semiconductor material. In the case of Si the intermediate layer would be made of $SiO_2$ or SiON for example. Alternatively, instead of the semiconductor an electrode material such as TIN can be used to form a MIM (metal-insulator-metal) capacitor.

Figures 3A, 3B, 3C, 3D:
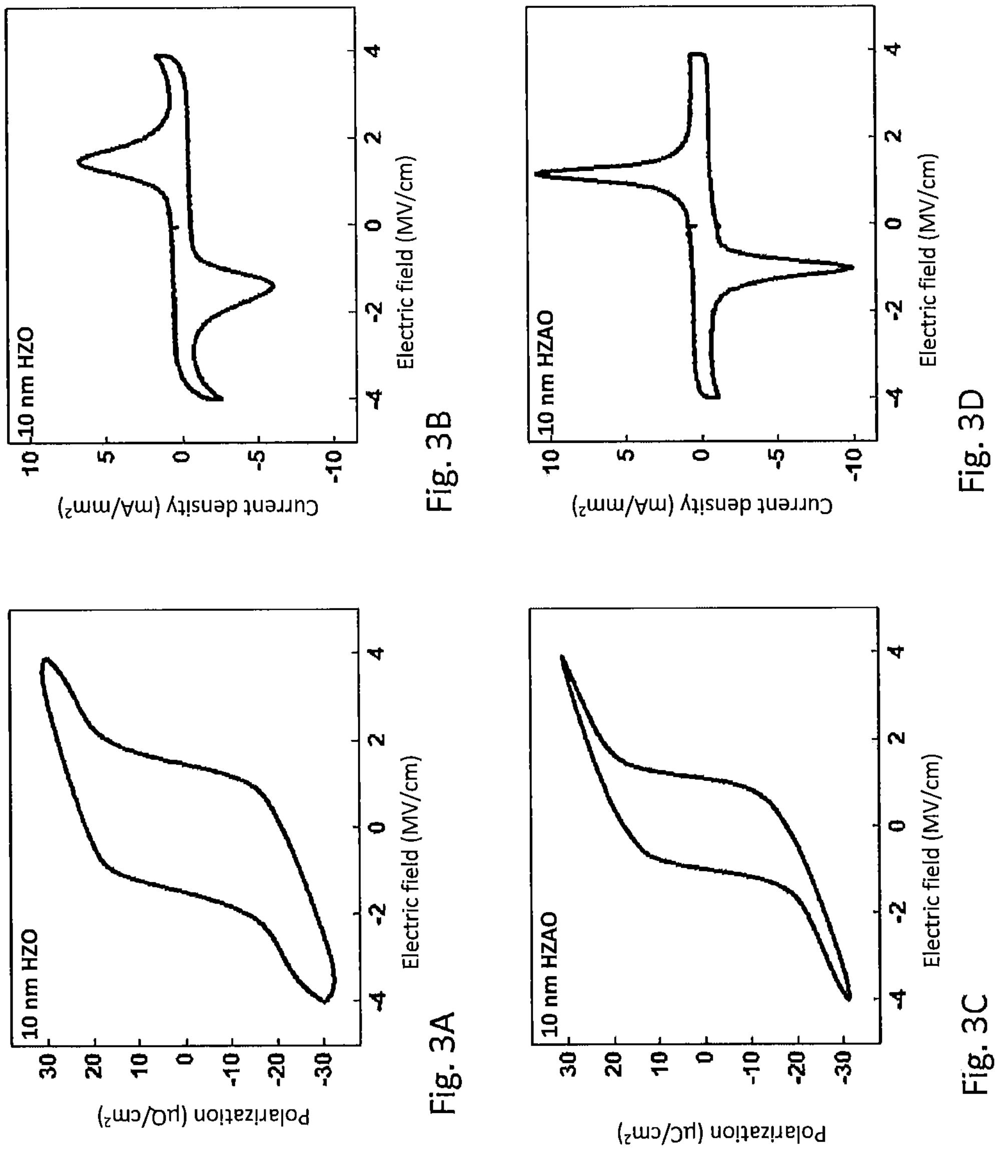
FIG. 3A shows measured values of the polarization and current density as function of the electric field for 10 nm thick HZO and HZAO layers.
FIG. 3B also shows measured values of the polarization and current density as function of the electric field for 10 nm thick HZO and HZAO layers.
FIG. 3C also shows measured values of the polarization and current density as function of the electric field for 10 nm thick HZO and HZAO layers.
FIG. 3D also shows measured values of the polarization and current density as function of the electric field for 10 nm thick HZO and HZAO layers.

In FIG. 3A the polarization and in FIG. 3B the current density of a 10 nm thick HZO layer is plotted against the electric field. The same graphs were also recorded in FIGS. 3C and 3D for a 10 nm thick HZAO layer. These measured values, which form the basis of the graphs, were recorded during the characterization of the structural elements from the exemplary embodiments 1 and 2. Firstly, in a comparison of FIGS. 3A and 3C the influence of the second dopant 4 (in this case Al) can be seen in that the HZAO layer forms a narrower hysteresis loop. It can be seen from this that a remagnetization of this layer is associated with a significantly lower energy input compared to the HZO layers. This is particularly relevant for applications in which a low energy consumption of the electronic structural elements is required.

In addition, the positive influence of the second dopant 4 on the reduction of the leakage currents can be clearly seen in FIGS. 3B and 3D. At the high electric field strengths (−4 and +4 MV/cm) the current density of the HZAO layers is significantly reduced compared to the current densities of the HZO layers. This can be explained by the smaller grain diameter of the HZAO layer, as this allows the leakage current paths to be reduced.

These properties of the described ferroelectric or antiferroelectric layer 2 thus lead as a whole to a higher reliability and to an optimized polarization switching.

In addition, for example, the reduced leakage current at high operating temperatures can contribute to meeting the AEC Q100 (Automotive Electronics Council) requirements, which are important for automotive applications. Furthermore, it is possible to reduce the layer thickness without compromising reliability properties. It is important for achieving low-voltage memories, as the power consumption can thus be reduced further.

Furthermore, this method for producing the structural element is very cost-effective and easy to integrate into existing processes. There is complete compatibility with known CMOS (complementary metal-oxide semiconductor) processes.

In addition, these layers can be applied in all fields of technology where ferroelectric or antiferroelectric layers are used and where a high reliability with reduced leakage currents would improve the performance of the structural element. Reference can be made here to storage technology for example.

What is claimed is:

1. A structural element, comprising:

a ferroelectric or antiferroelectric layer made of $HfO_2$ formed on a substrate, wherein the ferroelectric or antiferroelectric layer is doped with a first dopant comprising the element Zr and at least one second dopant comprising the element Al, wherein the dopant concentration of the first dopant is in a range of 40-50 at. % and the second dopant is present in a ratio of 1:16-20 to Hf.

2. The structural element according to claim 1, wherein the ferroelectric or antiferroelectric layer has a layer thickness of 1 nm to 20 nm.

3. The structural element according to claim 1, wherein the ferroelectric or antiferroelectric layer has a layer thickness of 5 nm to 15 nm.

4. The structural element according to claim 1, wherein the substrate is in the form of an electrode.

5. A method for producing a structural element according to claim 1, wherein the ferroelectric or antiferroelectric layer made of $HfO_2$ is deposited onto the substrate, and the ferroelectric or antiferroelectric layer is doped with the first dopant comprising the element Zr, and the ferroelectric or antiferroelectric layer doped with the first dopant is doped with the second dopant comprising the element Al, wherein the dopant concentration of the first dopant is in a range of 45-50 at. % and the second dopant is present in a ratio of 1:16-20 to Hf.

* * * * *